(12) United States Patent
Goto et al.

(10) Patent No.: US 11,527,694 B2
(45) Date of Patent: Dec. 13, 2022

(54) THERMOELECTRIC ELEMENT, THERMOELECTRIC DEVICE, AND METHOD FOR FORMING THERMOELECTRIC ELEMENT

(71) Applicants: GCE INSTITUTE INC., Tokyo (JP); NATIONAL INSTITUTE OF ADVANCED INDUSTRIAL SCIENCE AND TECHNOLOGY, Tokyo (JP)

(72) Inventors: Hiroshi Goto, Ushiku (JP); Minoru Sakata, Ushiku (JP); Ryutaro Maeda, Tsukuba (JP); Jian Lu, Tsukuba (JP)

(73) Assignees: GCE INSTITUTE INC., Tokyo (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 16/975,466

(22) PCT Filed: Feb. 18, 2019

(86) PCT No.: PCT/JP2019/005794
§ 371 (c)(1),
(2) Date: Aug. 25, 2020

(87) PCT Pub. No.: WO2019/167691
PCT Pub. Date: Sep. 6, 2019

(65) Prior Publication Data
US 2021/0020820 A1      Jan. 21, 2021

(30) Foreign Application Priority Data
Feb. 28, 2018    (JP) .............................. JP2018-034143

(51) Int. Cl.
*H01L 35/26*     (2006.01)
*H01L 35/34*     (2006.01)

(52) U.S. Cl.
CPC .............. *H01L 35/26* (2013.01); *H01L 35/34* (2013.01)

(58) Field of Classification Search
CPC ......... H01L 35/30; H01L 35/26; H01L 35/02; H01L 35/32; H01L 37/00; H01J 45/00;
(Continued)

(56) References Cited

U.S. PATENT DOCUMENTS

| 7,211,439 B2 | 5/2007 | Vossmeyer et al. |
| 2003/0184188 A1 | 10/2003 | Kucherov et al. |

(Continued)

FOREIGN PATENT DOCUMENTS

| EP | 1215485 A1 | 6/2002 |
| JP | 2002540636 A | 11/2002 |

(Continued)

OTHER PUBLICATIONS

International Search Report (ISR) (and English translation thereof) dated Mar. 12, 2019 issued in International Application No. PCT/JP2019/005794.

(Continued)

*Primary Examiner* — Andrew J Golden
(74) *Attorney, Agent, or Firm* — Holtz, Holtz & Volek PC

(57) ABSTRACT

A thermoelectric element to convert thermal energy into electrical energy includes a first electrode part, a second electrode part having a different work function than the first electrode part and arranged at a distance from the first electrode part, on a same surface of a substrate as the first electrode part, and a middle part provided between the first electrode part and the second electrode part.

12 Claims, 8 Drawing Sheets

(58) Field of Classification Search
CPC ........ H02N 3/00; H02N 11/00; H02N 11/002; H02N 11/008
See application file for complete search history.

(56) References Cited

U.S. PATENT DOCUMENTS

| | | |
|---|---|---|
| 2004/0050415 A1 | 3/2004 | Kucherov et al. |
| 2005/0104185 A1* | 5/2005 | Shimogishi ............ H01L 35/32 257/686 |
| 2005/0134167 A1 | 6/2005 | Deguchi et al. |
| 2009/0084162 A1 | 4/2009 | Besnard et al. |
| 2011/0139205 A1 | 6/2011 | Kimura et al. |
| 2012/0153772 A1* | 6/2012 | Landa .................... H01J 45/00 310/309 |
| 2012/0299438 A1 | 11/2012 | Kimura et al. |
| 2013/0203201 A1* | 8/2013 | Britton .................. H01C 7/041 438/54 |
| 2015/0229013 A1 | 8/2015 | Birmingham et al. |

FOREIGN PATENT DOCUMENTS

| | | |
|---|---|---|
| JP | 2005539401 A | 12/2005 |
| JP | 2008147323 A | 6/2008 |
| JP | 2008228478 A | 9/2008 |
| JP | 2011124412 A | 6/2011 |
| JP | 2012248618 A | 12/2012 |
| JP | 2013229971 A | 11/2013 |
| JP | 2014236058 A | 12/2014 |
| JP | 6147901 B1 | 5/2017 |
| WO | 2005036662 A1 | 4/2005 |

OTHER PUBLICATIONS

Written Opinion dated Mar. 12, 2019 issued in International Application No. PCT/JP2019/005794.
Extended European Search Report (EESR) dated Oct. 14, 2021, issued in European Application No. 19760809.

* cited by examiner

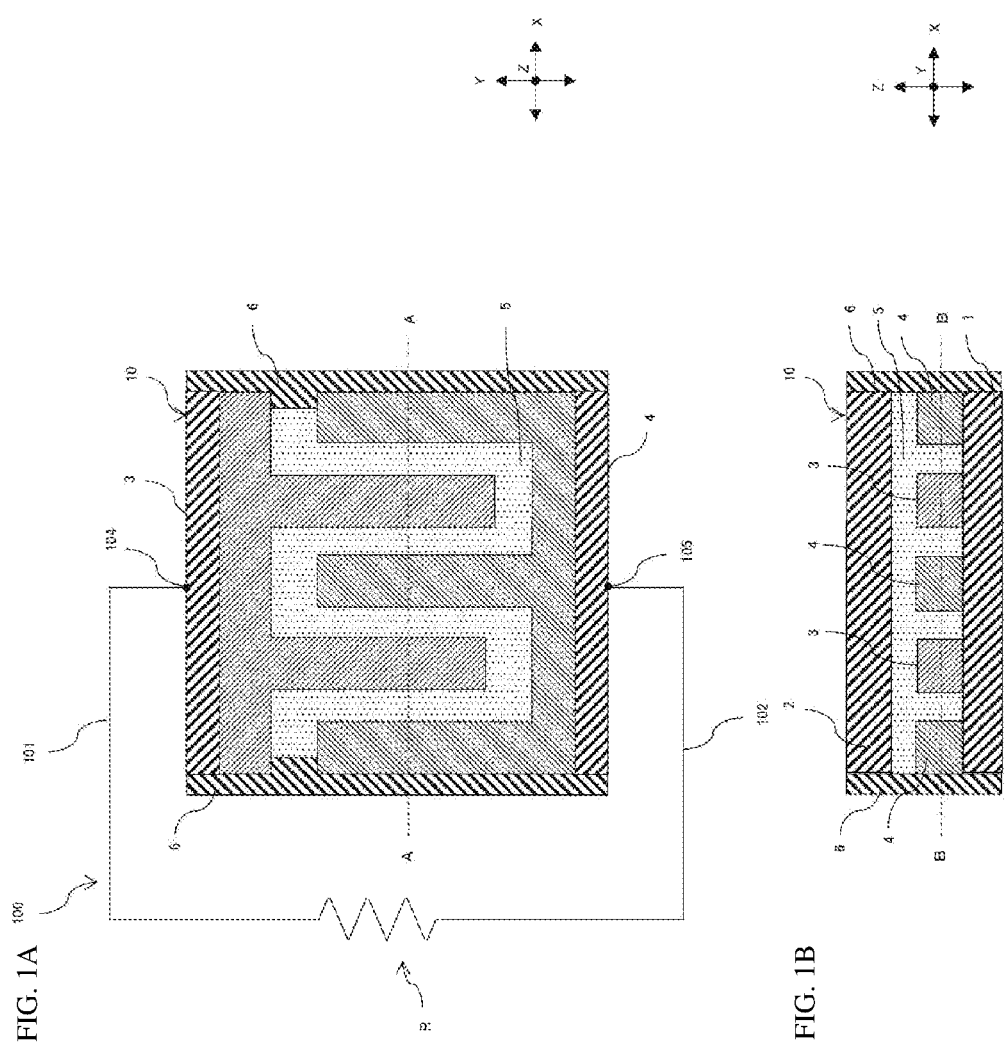

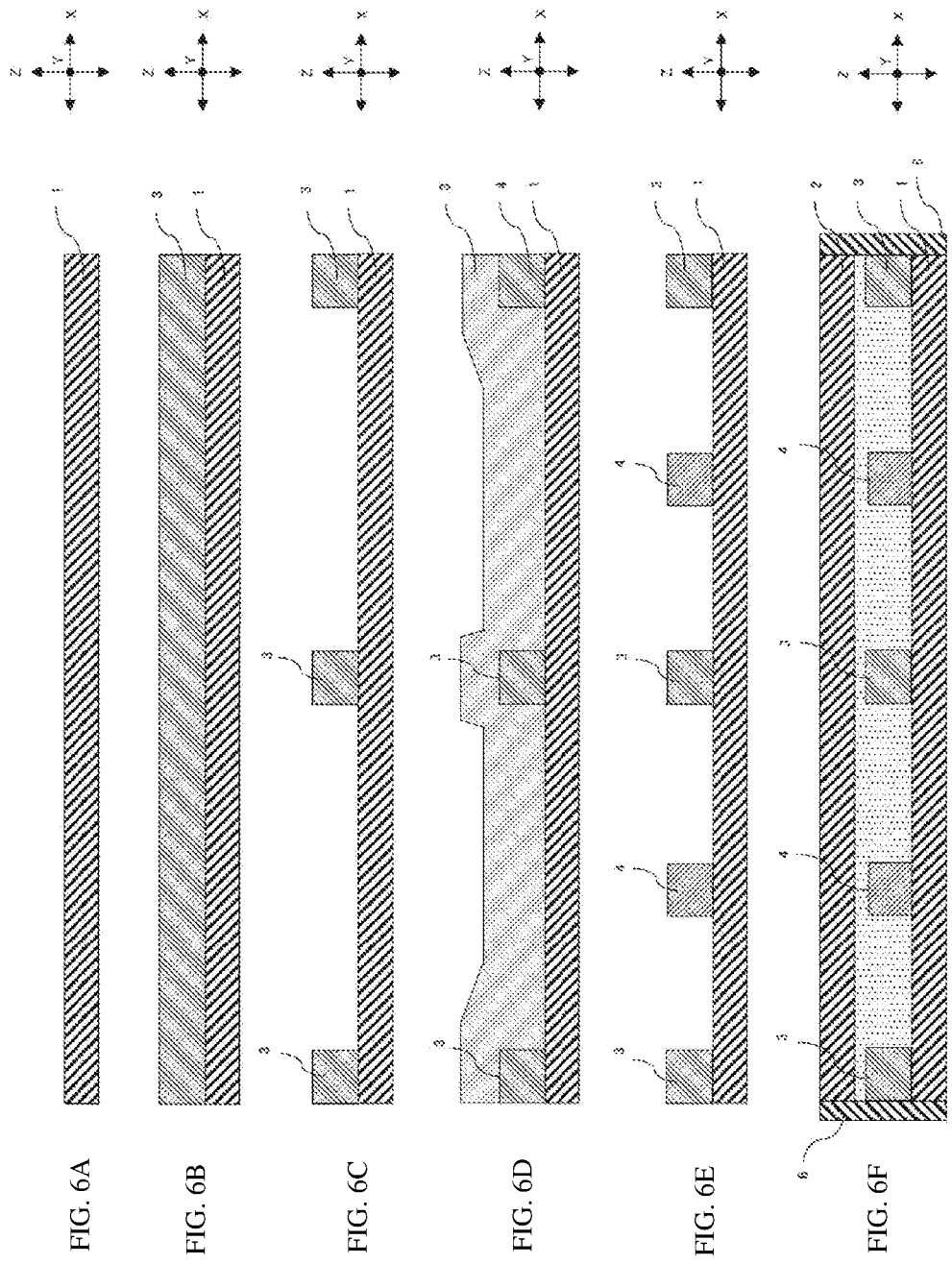

THERMOELECTRIC ELEMENT, THERMOELECTRIC DEVICE, AND METHOD FOR FORMING THERMOELECTRIC ELEMENT

TECHNICAL FIELD

The present invention relates to a thermoelectric element that converts thermal energy into electrical energy, a thermoelectric device, and a method for forming the thermoelectric element.

BACKGROUND ART

In recent years, thermoelectric elements that generate electrical energy by utilizing thermal energy (absolute temperature) have been developed on an active scale. In particular, the thermoelectric element disclosed in Patent Literature 1, for example, has been proposed in relation to the generation of electrical energy using the differences between the work functions of electrode parts. Such a thermoelectric element is expected to be used for various purposes, as opposed to configurations for generating electrical energy by using the temperature differences that apply to electrodes.

Patent Literature 1 discloses a thermoelectric element that has an emitter electrode part, a collector electrode part, and electrically insulating and spherical nano-beads, which are distributed and arranged over the surfaces of the emitter electrode part and the collector electrode part, which separate the emitter electrode part and the collector electrode part at submicron intervals, and in which the work function of the emitter electrode part is smaller than the work function of the collector electrode part, and the particle size of the spherical nano-beads is 100 nm or less.

CITATION LIST

Patent Literature

Patent Literature 1: Japanese Patent No. 6147901

SUMMARY OF INVENTION

Problem to be Solved by the Invention

Here, when this thermoelectric element is used as a thermoelectric device, a structure (laminate), in which the electrode parts are laminated, is required in order to achieve increased current and voltage. However, when electrode parts are connected in series in a laminate, if one spot of the electrode parts is short-circuited, this might cause abnormal heat generation and/or the like. Therefore, there is a concern that the structure in which electrode parts are laminated fails to show stable characteristics.

Furthermore, in the electrode structure of the above conventional thermoelectric element to use spherical nano-bead particles, a micro gap is formed between two electrode surfaces, and the size of the micro gap is adjusted using micro spacers, nano beads and/or the like. With this conventional gap structure, it is difficult to form a micro gap because what gap can be formed is determined by the height accuracy of the spacers, or whether the gap can be uniform within the surfaces of the electrodes depends on the accuracy of the surfaces of the electrodes.

Furthermore, the difficulty of setting the gap as designed leads to a decrease in output stability, and to an increase in the cost of processing due to the complexity of the manufacturing process, and therefore its practicality is in question.

The present invention has been made in view of the above-described problems, and it is therefore an object of the present invention to provide a thermoelectric element that is easy to form and achieves stable characteristics, a thermoelectric device, and a method for forming the thermoelectric element.

Means for Solving the Problems

A thermoelectric element according to a first invention converts thermal energy into electrical energy, and includes a first electrode part, a second electrode part having a different work function from that of the first electrode part and arranged at a distance from the first electrode part, on the same surface of the first substrate, and a middle part provided between the first electrode part and the second electrode part and including nanoparticles.

Based on the first invention, in the thermoelectric element according to a second invention, the first electrode part and the second electrode part are each shaped like comb teeth.

Based on the first invention, in the thermoelectric element according to a third invention, the first electrode part and the second electrode part are each shaped spiral or annular.

Based on any one of the first invention to the third invention, in the thermoelectric element according to a fourth invention, the first distance between the first electrode part and the second electrode part is 10 μm or less, and the diameter of the nanoparticles is 1/10 or less of the first distance.

Based on any one of the first invention to the fourth invention, in the thermoelectric element according to a fifth invention, the nanoparticles have a coating of a different material from that of nanoparticles provided on the surface, and the thickness of the coating is 0.2 nm or more and 5.0 nm or less.

Based on any one of the first invention to the fifth invention, in the thermoelectric element according to a sixth invention, the nanoparticles have a work function between the work function of the first electrode part and the work function of the second electrode part.

Based on any one of the first invention to the sixth invention, in the thermoelectric element according to a seventh invention, the middle part includes a solvent having a boiling point of 60° C. or higher.

Based on any one of the first invention to the seventh invention, in the thermoelectric element according to an eighth invention, the middle part is filled only with the nanoparticles.

Based on any one of the first invention to the seventh invention, in the thermoelectric element according to a ninth invention, the middle part further includes a second substrate and an insulating part in contact with the middle part.

A thermoelectric device according to a tenth invention converts thermal energy into electrical energy, includes a first electrode part, a second electrode part having a different work function from that of the first electrode part and arranged at a distance from the first electrode part, on the same surface of the first substrate, and a middle part provided between the first electrode part and the second electrode part and including nanoparticles, and is provided with first wiring and second wiring electrically connected with the first electrode part and the second electrode part.

Based on the tenth invention, in the thermoelectric device according to an eleventh invention, the first electrode part and the second electrode part are each shaped like comb teeth.

Based on the tenth invention, in the thermoelectric device according to a twelfth invention, the first electrode part and the second electrode part are each shaped spiral or annular.

Based on one of the tenth invention to the twelfth invention, in the thermoelectric device according to a thirteenth invention, the middle part further includes a second substrate and an insulating part in contact with the middle part.

A method for forming a thermoelectric element according to a fourteenth invention is for forming a thermoelectric element to convert thermal energy into electrical energy, and includes a first step of forming a first electrode part on a first substrate, a second step of forming a second electrode part having a different work function from that of the first electrode part, at a distance from the first electrode part, on a same surface of the first substrate, and a third step of forming a middle part between the first electrode part and the second electrode part and including nanoparticles.

Based on the fourteenth invention, the method for forming a thermoelectric element according to a fifteenth invention is for forming a thermoelectric element to convert thermal energy into electrical energy, the first step and the second step including shaping each of the first electrode part and the second electrode part like comb teeth.

Based on the fourteenth invention, the method for forming a thermoelectric element according to a sixteenth invention is for forming a thermoelectric element to convert thermal energy into electrical energy, the first step and the second step including shaping each of the first electrode part and the second electrode part spiral or annular.

Based on any one of the fourteenth invention to the sixteenth invention, in the method for forming a thermoelectric element according to a seventeenth invention, the third step is performed after the first step and the second step, and includes forming a second substrate and an insulating part that are in contract with the middle part.

Advantageous Effects of Invention

According to the first invention to the ninth invention, the first electrode part and the second electrode part are formed in thin and wide-area shapes on the same surface of the first substrate. This makes it possible to make a thermoelectric element with accurate amounts of gaps between electrodes, at ease, so that the characteristics of the thermoelectric element can be set as designed. Consequently, variations in performance when a plurality of thermoelectric elements are manufactured can be kept low. Therefore, ease of formation and stability of characteristics can be both achieved.

Furthermore, since electrodes are formed on the same first substrate, the gaps between the electrodes do not change and can be kept constant even when the temperature changes, and this makes it possible to achieve stable output characteristics even when the temperature changes. Furthermore, it is possible to shape each electrode part and the middle part with greater flexibility, so that efficient and stable characteristics can be achieved.

In particular, the second invention and the third invention each provide a configuration of a thermoelectric element, in which the shapes of the electrode parts on the same surface of the first substrate are comb-shaped, spiral or annular. Consequently, an optimal configuration can be provided by combining areas of the first substrate, electrode parts and so forth. As a result of this, efficient and stable characteristics can be achieved depending on the location of installation, the purpose of use, and so forth. It is possible to make a thermoelectric element with accurate amounts of gaps between electrodes, at ease, and the characteristics of the thermoelectric element can be set as designed. Furthermore, variations in performance when a plurality of thermoelectric elements are manufactured can be kept low.

In particular, the ninth invention provides a configuration of a thermoelectric element, in which the middle part is filled with nanoparticles, and in which the middle part is closed by the insulating part. Therefore, the deterioration of electrodes and nanoparticles can be reduced. This makes it possible to achieve stable characteristics.

According to the tenth invention to the thirteenth invention, the first electrode part and the second electrode part are formed in thin and wide-area shapes on the same surface of the first substrate. This makes it possible to make a thermoelectric element with accurate amounts of gaps between electrodes, at ease, so that the characteristics of the thermoelectric element can be set as designed. Therefore, variations in performance when a plurality of thermoelectric elements are manufactured can be kept low. Therefore, ease of formation and stability of characteristics can be both achieved.

According to the tenth invention to the thirteenth invention, the first electrode part and the second electrode part are formed in thin and wide-area shapes on the same surface of the first substrate, and the first wiring and the second wiring electrically connected with the first electrode part and the second electrode part, can be arranged freely. As a result of this, efficient and stable characteristics can be achieved depending on the location of installation location and the purpose of use. Furthermore, it is possible to make a thermoelectric element with accurate amounts of gaps between electrodes, at ease, so that the characteristics of the thermoelectric element can be set as designed. Furthermore, variations in performance when a plurality of thermoelectric elements are manufactured can be kept low. It is possible to shape each electrode part and the middle part with greater flexibility, so that efficient and stable characteristics can be achieved.

In particular, the eleventh invention and the twelfth invention each provide a configuration of a thermoelectric element, in which the shapes of the electrode parts on the same surface of the first substrate are comb-shaped, spiral or annular. Consequently, an optimal configuration can be provided by combining areas of the first substrate, electrode parts and so forth. This makes it possible to achieve stable output characteristics even when the temperature changes. Furthermore, it is possible to shape each electrode part and the middle part with greater flexibility, so that efficient and stable characteristics can be achieved.

In particular, the thirteenth invention provides a configuration of a thermoelectric element, in which the middle part is filled with nanoparticles, and in which the middle part is closed by the insulating part. This makes it possible to make a thermoelectric element with accurate amounts of gaps between electrodes, at ease, so that the characteristics of the thermoelectric element can be set as designed. Therefore, variations in performance when a plurality of thermoelectric elements are manufactured can be kept low.

According to the fourteenth invention and the seventeenth invention, the first electrode is formed on the first substrate, and then the second electrode, which has a different work function from that of the first electrode part, is placed at a distance from the first electrode part, on the same surface of the substrate, to form a middle part. This makes it possible to make a thermoelectric element with accurate amounts of gaps between electrodes, at ease, so that the characteristics of the thermoelectric element can be set as designed. Therefore, variations in performance when a plurality of thermoelectric elements are manufactured can be kept low. Therefore, ease of formation and stability of characteristics can be both achieved.

Also, electrodes are formed on the same substrate of the thermoelectric element, depending on the shape and number of each electrode part (the number of comb teeth if the electrode part is shaped like comb teeth, the number of circles or spirals if the electrode part is spiral or annular, etc.), so that the gaps between electrodes do not change and can be kept constant even when the temperature changes. This makes it possible to achieve stable output characteristics even when the temperature changes. Furthermore, it is possible to shape each electrode part and the middle part with greater flexibility, so that efficient and stable characteristics can be achieved.

BRIEF DESCRIPTION OF DRAWINGS

FIG. 1A is a schematic cross-sectional view, taken along line B-B in FIG. 1B, to show an example of the configuration of a comb-tooth-like thermoelectric element and a thermoelectric device according to an embodiment, and FIG. 1B is a schematic cross-sectional view along line A-A in FIG. 1A;

FIGS. 6A to 6F are schematic cross-sectional views to show a first modification of the method for manufacturing a thermoelectric element according to the present embodiment;

DESCRIPTION OF EMBODIMENTS

Figure 2A:
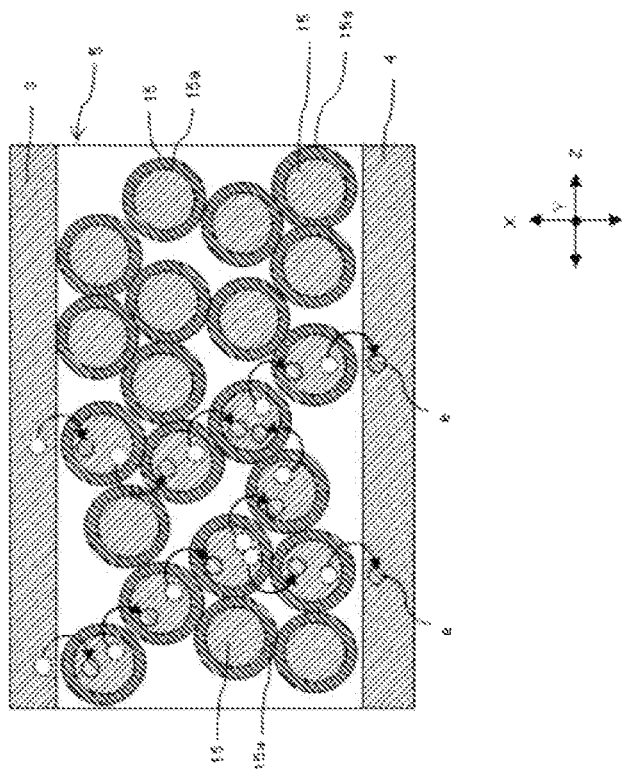
FIG. 2A is a schematic cross-sectional view to show an example of a middle part.

Hereinafter, an example of a thermoelectric element and a thermoelectric device according to an embodiment of the present invention will be described with reference to the accompanying drawings. Note that, in each drawing, the lamination direction Z is the direction in which each substrate, each electrode part and so forth are laminated, and the directions to intersect the lamination direction Z are the first direction X and the second direction Y, respectively.

(Configurations of Thermoelectric Element 10 and Thermoelectric Device 100)

An example of the configurations of a thermoelectric element 10 and a thermoelectric device 100 according to the present embodiment will be described below with reference to FIGS. 1A and 1B. FIG. 1A is a schematic cross-sectional view to show the comb-tooth-like thermoelectric element 10 and the thermoelectric device 100 according to the present embodiment, and FIG. 1A is a schematic cross-sectional plan view, taken along line B-B in FIG. 1B.

FIG. 1B is a schematic cross-sectional view to show the comb-tooth-like thermoelectric element 10 and the thermoelectric device 100 according to the present embodiment, and is a schematic cross-sectional plan view taken along line A-A in FIG. 1A.

As shown in FIGS. 1A and 1B, the thermoelectric device 100 supplies the current generated in the thermoelectric element 10 to a load R connected to a first wiring 101 and a second wiring 102. The thermoelectric device 100 is applied to, for example, solar power generation, and provided in, for example, IoT (Internet of Things) devices, mobile devices such as wearable devices, or independent sensor terminals, and can be used as an alternative or aid to a battery.

The thermoelectric element 10 can generate a current by converting the thermal energy, generated from a heat source such as, for example, a CPU (Central Processing Unit) for an electronic device, an automobile engine, factory production facility and so forth, into electrical energy. The thermoelectric element 10 is formed on a first substrate, which serves as a base, includes, for example, an anode (first electrode part 3: aluminum, for example) and a cathode (second electrode part 4: platinum, for example), and, in addition, includes a middle part 5 and insulating parts 6, for example.

<Substrate>

The substrate serves as a base for the thermoelectric element 10, has a planar shape, and forms a plurality of electrodes on its plane. The substrate has two substrates, namely a lower first substrate 1, which serves a base for the thermoelectric element 10, and an upper second substrate 2, which covers the thermoelectric element 10. The first electrode part 3, the second electrode part 4 and the middle part 5 are arranged between the lower first substrate 1 and the upper second substrate 2. This middle part 5 is filled with nanoparticles. This substrate preferably has insulating properties, and, in addition, has excellent properties such as, for example, smoothness, heat resistance, low thermal expansion, and so on. The first substrate 1 and the second substrate 2 may be shaped like films by using, for example, plate-like silicon, glass, or resin (polyimide), and, as for the material, PET (polyethylene terephthalate), PC (polycarbonate) or polyimide may be used, or, for example, single crystal silicon or glass may be used. The substrate may have a square shape, a rectangular shape, or other shapes, including a disk shape.

<Thermoelectric Element>

The thermoelectric element 10 is arranged in the upper surface direction Y of the first substrate 1. As examples of materials for the thermoelectric element 10, aluminum (Al) is used for the anode electrode, platinum (Pt) is used for the cathode electrode, and these electrodes are respectively formed using these. The thermoelectric element 10 (the first electrode part 3 and the second electrode part 4) is connected with a plurality of wiring (wiring 101 and wiring 102).

According to this embodiment, the first electrode part 3 and the second electrode part 4 are each shaped like comb teeth, and are arranged at a distance from each other and neighboring each other, on the same plane of the first substrate 1. In FIG. 1A, the first electrode parts 3 have two comb teeth and the second electrode part 4 has three comb teeth, but the number of comb teeth need not be the same between the first electrode part 3 and the second electrode part 4.

Furthermore, referring to FIG. 1B, although an example is shown in which the first electrode part 3 and the second electrode part 4 have the same height in the first direction X, their heights do not have to be uniform, and each first electrode part 3 and each second electrode part 4 may have different heights. The distance (gap) between the first electrode part 3 and the second electrode part 4 is preferably narrower than the area of the first substrate 1.

When thermal energy is applied to the thermoelectric element 10, thermoelectrons are emitted from the first electrode part 3 and the second electrode part 4, to the middle part 5. The emitted thermoelectrons are propagated to the first electrode part 3 or the second electrode part 4, via the nanoparticles dispersed in the middle part 5.

<Wiring>

The wiring 101 and 102 are connected to the thermoelectric element 10 formed on the first substrate 1, and extend in the second direction Y, from the terminals (terminal 104 and terminal 105) of the thermoelectric element 10. The wiring and the terminals preferably have excellent properties such as, for example, embedding property, heat resistance, or low thermal expansion, in addition to having conductivity. For the wiring, for example, nickel, copper, silver, gold, tungsten, or titanium can be used.

<Electrode Part>

The first electrode part 3 and the second electrode part 4 are formed on the upper surface of the first substrate 1, and the first electrode part 3 and the second electrode part 4 are electrically apart. The thickness of the first electrode part 3 and the second electrode part 4 in the first direction X and the second direction Y is, for example, 1 nm or more and 50 nm or less. The distance between the first electrode part 3 and the second electrode part 4 (first distance: gap between electrodes) is, for example, 10 μm or less, and preferably 10 nm or more and 100 nm or less.

The first electrode part 3 has a different work function from that of the second electrode part 4. With the present embodiment, the work function of the first electrode part 3 is smaller than the work function of the second electrode part 4. Note that, with the present embodiment, the first electrode part 3 will be described as a cathode (negative pole: −) and the second electrode part 4 will be described as an anode (positive pole: +), but the first electrode part 3 may be the anode, and the second electrode part 4 may be the cathode. In this case, the work function of the first electrode part 3 is smaller than the work function of the second electrode part 4.

For example, when tungsten (work function: 4.55 eV) is used for the first electrode part 3, platinum (work function: 5.65 eV) is used for the second electrode part 4. For example, in addition to aluminum and titanium, a multilayer film may be used for the first electrode part 3 and the second electrode part 4, and the material to use may be arbitrarily selected depending on the work function. Note that the formation of the first electrode part 3 and the second electrode part 4 can be realized using methods such as vapor deposition of metallic materials, sputtering, or screen printing or ink-jet application of metallic materials made into ink.

<Middle Part>

The middle part 5 is provided between and in contact with the first electrode part 3 and the second electrode part 4. The middle part 5 includes, for example, nanoparticles and a solvent. The middle part 5 is in a state of being filled with a solvent in which nanoparticles are dispersed, for example.

Figure 2B:
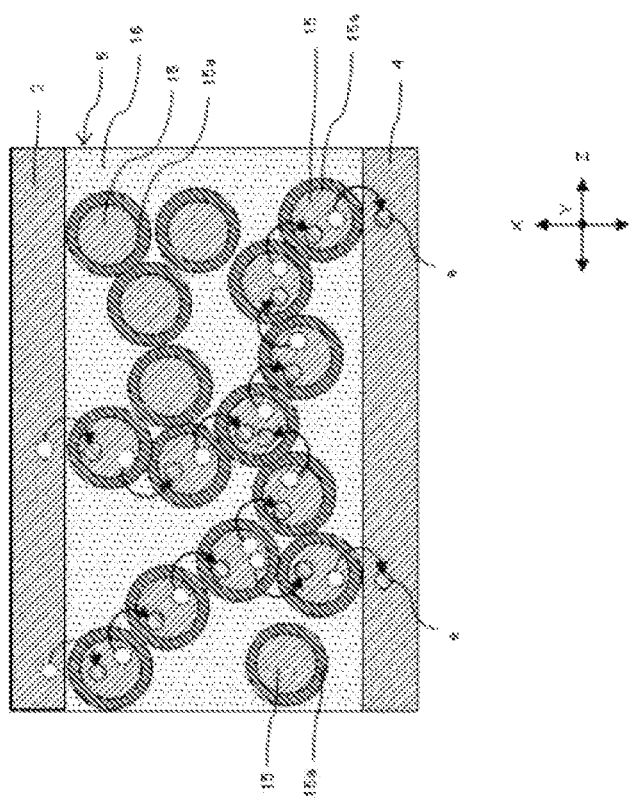
FIG. 2B is a schematic cross-sectional view to show another example of a middle part.

As shown in FIG. 2A, the middle part 5 includes, for example, nanoparticles 15 and a solvent 16. The middle part 5 is in a state of being filled with a solvent 16 in which nanoparticles 15 are dispersed, for example. As shown in FIG. 2B, for example, the middle part 5 may include no solvent 16, and show a state of being filled only with nanoparticles 15. Also, as shown in FIG. 1B, the middle part 5 may be sealed by insulating parts 6, or the thermoelectric element 10 may be surrounded (not shown).

<Nano Particles>

An example of the configurations of the thermoelectric element 10 and the thermoelectric device 100 according to the present embodiment will be described with reference to FIG. 2A. The nanoparticles 15 have a work function between the work function of the first electrode part 3 and the work function of the second electrode part 4, and, this is, for example, 3.0 eV or more and 5.5 eV or less. For example, at least one of gold and silver may be used for the nanoparticles 15, or for example, a material to satisfy the above work function range may be used.

For the nanoparticles 15, for example, a particle size that is 1/10 or less of the gap between electrodes may be used. To be more specific, a particle size of 2 nm or more and 10 nm or less may be used, and, in addition, for example, a particle size having an average particle size (D50) of 3 nm or more and 8 nm or less may be used. Note that the average particle size can be measured by a particle distribution measurement device to use a laser diffraction scattering method (for example, Nanotrac WaveII-EX150, manufactured by Microtrac BEL).

The nanoparticles 15 have, for example, a coating 15a made of a material that is different from that of the nanoparticles provided on the surface. For the coating 15a, for example, a metal oxide such as silicon oxide or alumina may be used, or, for example, an organic compound such as alkanethiol, or a semiconductor such as silicon may be used. The thickness of the coating 15a is, for example, 0.2 nm or more and 5.0 nm or less.

A liquid with a boiling point of 60° C. or higher is used as a solvent, and for example, at least one of an organic solvent and water is used. For the organic solvent, for example, methanol, ethanol, toluene, xylene, alkanethiol, tetradecane and so forth may be used.

According to the present embodiment, when thermal energy is applied to the thermoelectric element 10, thermoelectrons e are emitted from the first electrode part 3 and the second electrode part 4, to the middle part 5. The emitted thermoelectrons are propagated to the first electrode part 3 or the second electrode part 4, via the nanoparticles 15 dispersed in the middle part 5.

The amount of thermoelectrons emitted here depends on the work function of each electrode part, and there is a tendency that a greater amount of electrons are emitted when the work function of the material is smaller. That is, more thermoelectrons are emitted from the first electrode part 3 having a smaller work function than the second electrode part 4. Consequently, in all of the thermoelectrons that are emitted to the middle part 5, the amount of thermoelectrons that move from the first electrode part 3 to the second electrode part 4 tends to be greater than the amount of thermoelectrons that move from the second electrode part 4 to the first electrode part 3. By this means, thermal energy is converted into electrical energy, and a current to flow from the second electrode part 4 to the first electrode part 3 is generated.

The momentum of thermoelectrons emitted from the first electrode part 3 primarily depends on the thermal energy, and also depends on the work function of the first electrode part 3, the work function of the second electrode part 4, and the gap between electrodes. Therefore, by shortening the distance between the first electrode part 3 and the second electrode part 4, the amount of electrical energy to be generated can be increased.

In particular, the first electrode part 3 preferably has one layer that is not refractory metal. Here, refractory metal refers to niobium, molybdenum, tantalum, tungsten, rhenium, or the like. For the first electrode part 3, for example, any one of carbon-based materials such as aluminum, silicon, lanthanum hexaboride ($LaB_6$), and graphene is used. In particular, aluminum is excellent in workability, silicon is excellent in productivity, and lanthanum hexaboride has a low work function, so that the material can be selected according to the purpose of use. Furthermore, the above-mentioned materials can all be used under high temperature. This makes it possible to increase the amount of electrical energy to be generated.

The solvent 16, in which nanoparticles are dispersed, is filled in the micro space between the second substrate 2 and the first electrode part 3 and the second electrode part 4, and the micro space between the first electrode part 3 and the second electrode part 4 by using, for example, capillary phenomenon, and the middle part 5 is formed. Following that, the middle part 5 is sealed. A material having an insulating property may be used for this sealing, and, for example, the same kind of material as that of the substrate may be used.

<Insulating Part>

As shown in FIGS. 1A and 1B, the insulating part 6 is provided at a position where the first substrate is not in contact with the first electrode part 3 and the second electrode part 4, and seals the outflow of nanoparticles included in the middle part 5. In FIGS. 1A and 1B, both side surfaces of the thermoelectric element 10 in the first direction X have insulating parts 6, but it is also possible to provide insulating parts 6 outside the first substrate of the thermoelectric element 10, or on the sides of the wiring 101 and 102 (terminal sides) of the first electrode part 3 and the second electrode part 4.

Note that the insulating parts 6 are preferably a material having an insulating property, and for example, may be the same type of material as that of the substrate. For example, it is preferable to have excellent properties such as smoothness, heat resistance, and low thermal expansion. The insulating parts 6 may be shaped like thin films, by using, for example, plate-like silicon, glass, or resin (polyimide), and, as for the material, PET (polyethylene terephthalate), PC (polycarbonate), or polyimide may be used, and, in addition, for example, single crystal silicon or glass may be used.

(Method for Manufacturing Thermoelectric Element 10)

Figure 3:
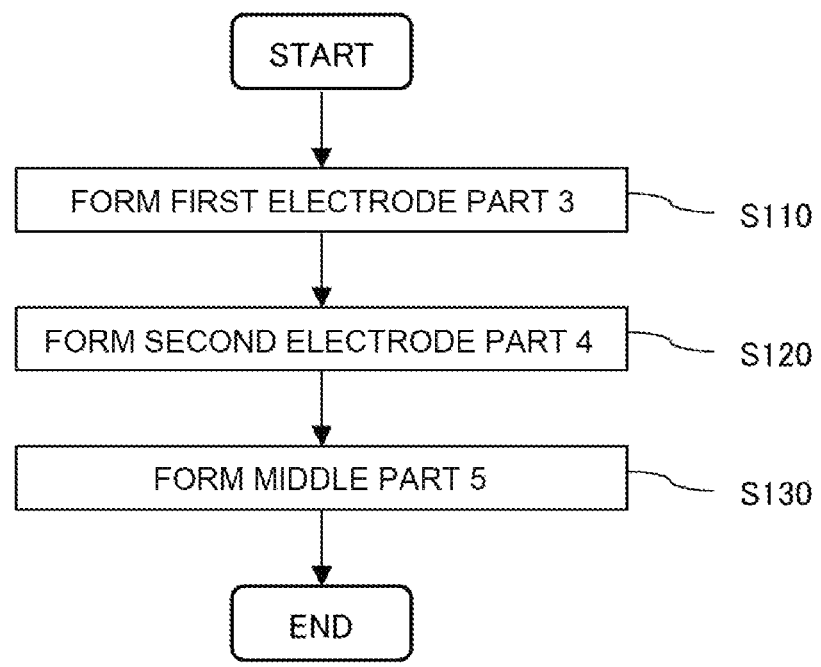
FIG. 3 is a flowchart to show an example of the method for manufacturing a thermoelectric element according to an embodiment.
Figure 4:
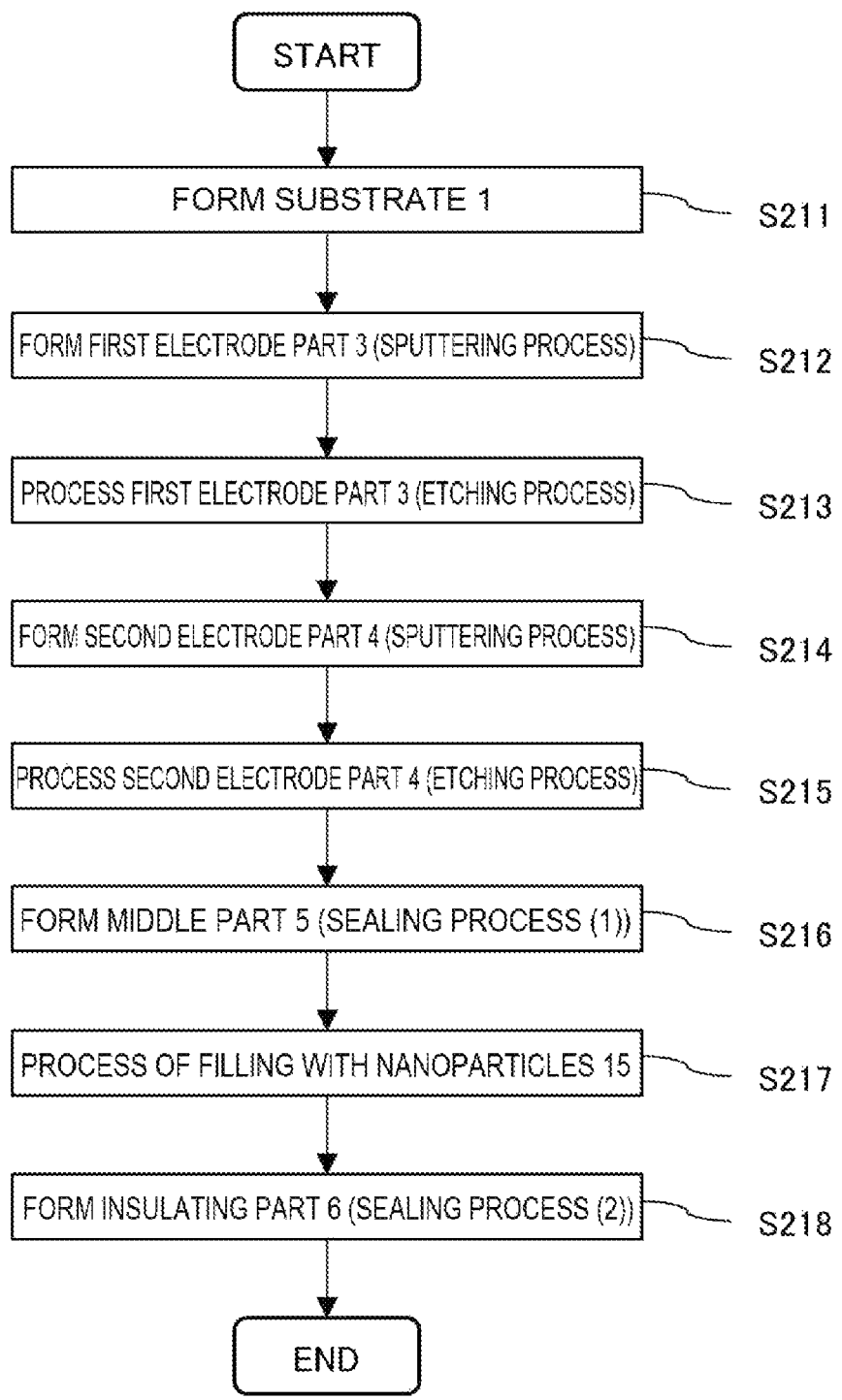
FIG. 4 is a flowchart to show a first example (comb-tooth-like) of the method for manufacturing a thermoelectric element according to the present embodiment.
Figure 5:
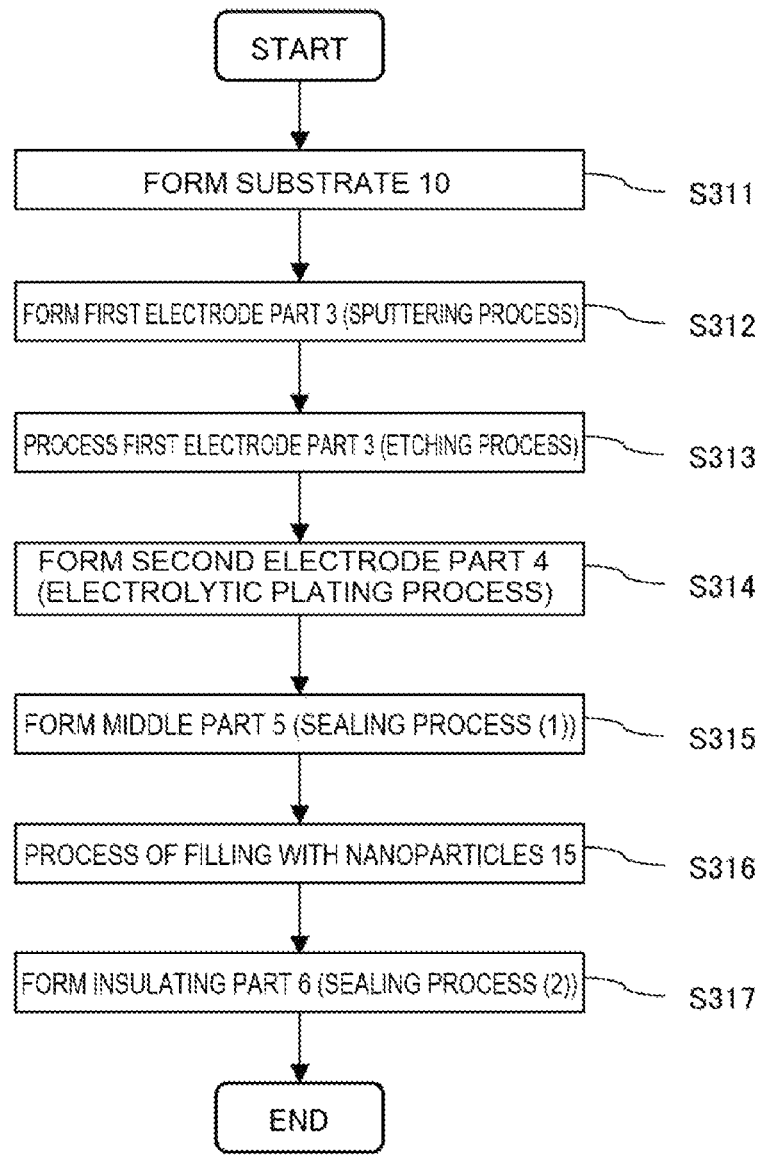
FIG. 5 is a flowchart to show a second example of the method for manufacturing a thermoelectric element according to the present embodiment.

Next, an example of the method for manufacturing the thermoelectric element 10 according to the present embodiment will be described with reference to FIGS. 3 to 7. FIG. 3 to FIG. 5 are flowcharts, each showing an example of the method for manufacturing the thermoelectric element 10 according to an embodiment. FIGS. 6A-7E are schematic cross-sectional views, each showing an example of the method for manufacturing the thermoelectric element 10 according to an embodiment.

As shown in FIG. 3, the method for manufacturing the thermoelectric element 10 according to the present embodiment is a method for forming a thermoelectric element that converts thermal energy into electrical energy, and includes a first step of forming a first electrode on a first substrate (S110), a second step of forming a second electrode part that has a different work function from that of the first electrode part, and that is placed at a distance from the first electrode part on the same surface of the first substrate (S120), and a third step forming a middle part that is provided between the first electrode part and the second electrode part, and that includes nanoparticles (S130).

FIG. 4 is a flowchart to show an example of the method for manufacturing the thermoelectric element 10 according to the present embodiment, and shows processes in which two kinds of metals are formed separately in two processes. FIGS. 6A-7F are schematic cross-sectional views to show an example of the method for manufacturing the thermoelectric element 10 according to the present embodiment, and shows processes in which two kinds of metals are formed separately in two processes, including each of steps S110 to S130 described above.

<Step 211 to Step 213>

First, in S211, using glass or silicon, or a heat-resistant resin substrate (polyimide, etc.) for the first substrate, on which the first electrode part 3 and the second electrode part 4 are formed, preparations are made for forming the first electrode part 3 on the surface of the first substrate 1.

Next, in S212, the first metal (aluminum, for example) is formed into the first electrode part 3 by, for example, a sputtering method, on the surface of the first substrate 1. Here, the first substrate 1, on which aluminum to serve as the raw material of the thin film for use for the first electrode part 3 is placed, is set in a predetermined device (chamber: not shown) and then placed in a vacuum state, and, following this, injection of an argon gas and other processes take place, and the process of forming an aluminum thin film is performed.

In S213, an electrode part's pattern (one of a pair of two comb-tooth-like, spiral or annular patterns) is drawn on the first substrate 1, and processes like applying the photoresist and exposure take place, and developing and hardening processes are performed to remove the photoresist from the unexposed portion.

Following this, the aluminum part is exposed, the exposed part of aluminum not covered with the photoresist is dissolved and removed, and a thin film of aluminum is formed. Following that, an etching process is applied, and processing is performed according to the shape of the first electrode part 3 (comb-tooth-like, spiral or annular). Following that, a peeling process is performed to remove the photoresist on the surface of the etched first substrate 1.

<Step 214 and Step 215>

In S214, following the formation over the processes up to S213, a second metal (platinum, for example) is formed into the second electrode part 4, by, for example, a sputtering method, on the same surface of the first substrate 1, on which the first electrode part 3 is formed. In this process, the first substrate 1, on which platinum to serve as the raw material of the thin film for use for the second electrode part 4 is placed, is set in a predetermined device (chamber: not shown) and then placed in a vacuum state, and, following this, injection of an argon gas and other processes take place, and the process of forming a platinum thin film is performed.

In S215, the pattern of the electrode part 3 (the other, remaining pattern of a pair of two comb-tooth-like, spiral or annular patterns) is drawn on the first substrate 1, and processes like applying the photoresist and exposure take place, and developing and hardening processes are performed to remove the photoresist from the unexposed portion.

Following this, the platinum portion is exposed, the exposed part of the metal that is not covered with the photoresist is dissolved and removed, and a thin film of aluminum is formed. Following that, an etching process is applied, and processing is performed according to the shape of the second electrode part 4 (comb-tooth-like, spiral or annular). Following that, a peeling process is performed to remove the photoresist on the surface of the etched first substrate 1. By performing these steps, the patterns of the first electrode part 3 and the second electrode part 4 can be formed, at a distance from each other, on the same surface of the first substrate 1.

<Steps 216 to 218>

Next, the middle part 5 to include the nanoparticles 15 and the solvent 16 is formed. The middle part 5 is formed in the space sealed by the first electrode part 3 and the second electrode part 4 formed on the surface, the second substrate 2, and the insulating parts 6. The micro space (unfilled portion) in this space (middle part 5) is filled with nanoparticles 15. By this means, the conversion part of the thermoelectric element is formed.

For example, a thermoelectric element 10 formed with the substrates 1 and 2, first electrode part 3, second electrode part 4, and insulating parts 6, is immersed in a stock solution of nanoparticles 15, so that the micro space (unfilled part) of the middle part 5 can be filled by the capillary phenomenon. The middle part 5 is filled from the side surface in the second direction Y, from a predetermined unsealed portion.

Then, terminals (terminal 104 and terminal 105) are formed in the first electrode part 3 and the second electrode part 4, respectively, and the wiring (wiring 104 and wiring 105) of each terminal (terminal 104 and terminal 105) is formed.

Note that other methods of forming wiring may be used here, including, for example, techniques that are used in the semiconductor element forming process, and, for example, at least one of a screen printing method, an etching method, an inkjet method, and a plating method may be used for forming the wiring.

Here, FIGS. 6A to 6F are schematic cross-sectional views, each showing an example of the method for manufacturing the thermoelectric element according to the present embodiment of FIG. 4, including each of steps S110 to S130.

FIGS. 6A to 6C correspond to steps S211 to S213 of FIG. 4, in which the first substrate 1 is formed, a thin film of aluminum is formed on the surface of the first substrate 1, and, following this, the first electrode part 3 is formed. In this case, only one of the electrode part patterns is formed.

FIGS. 6D and 6E correspond to S214 and S215 of FIG. 4, in which the second electrode part 4 is formed on the first substrate 1, on which the first electrode part 3 is formed.

FIG. 6F corresponds to steps S216 to S218 of FIG. 4, in which the middle part 5 is formed, and sealing is done so as to secure the micro space in the middle part 5, and insulating parts 6, which serve as sealing for filling the middle part 5 with nanoparticles 15 and closing the filled nanoparticles 15, are formed.

Furthermore, according to the present embodiment, a thermoelectric element can be manufactured with accurate amounts of gaps between electrodes on the same plane, in a simple manner, so that the characteristics of the thermoelectric element can be set as designed. Consequently, the variation in performance when a plurality of thermoelectric elements can be kept low.

Furthermore, since each electrode part is formed on the same substrate, the gaps between the electrodes do not change even when the temperature changes, and can be kept constant, and this makes it possible to achieve stable output characteristics even when the temperature changes. Furthermore, it is possible to shape each electrode part and the middle part with greater flexibility, so that efficient and stable characteristics can be achieved.

(Variation of Method for Manufacturing Thermoelectric Element 10)

Next, a variation of the method for manufacturing the thermoelectric element 10 according to the present embodiment will be described with reference to FIG. 5. FIG. 5 is a flowchart to show a variation of the method for manufacturing the thermoelectric element 10 according to the present embodiment, and shows processes in which electrode patterns are formed with one kind of metal, and in which, following that, the metal of either the anode or the cathode is formed by electrolytic plating. FIGS. 7A-7E are schematic cross-sectional views to show an example of the method for manufacturing the thermoelectric element 10 according to the present embodiment, and shows processes in which electrode patterns are formed with one kind of metal, and in which, following that, the metal of either the anode or the cathode is formed by electrolytic plating.

<Step 311 to Step 313>

First, in S311, using glass or silicon, or a heat-resistant resin substrate (polyimide, etc.) for the substrate, on which the first electrode part 3 and the second electrode part 4 are formed, preparations are made for forming the first electrode part 3 (or the second electrode part 4) on the surface of the first substrate 1.

Next, in S312, the first metal (aluminum, for example) is formed into the first electrode part 3 by, for example, a sputtering method, on the surface of the first substrate 1. Here, the first substrate 1, on which aluminum to serve as the raw material of the thin film for use for the first electrode part 3 is placed, is set in a predetermined device (chamber: not shown) and then placed in a vacuum state, and, following this, injection of an argon gas and other processes take place, and the process of forming an aluminum thin film is performed.

In S313, an electrode part's pattern (one of a pair of two comb-tooth-like, spiral or annular patterns) is drawn on the first substrate 1, and processes like applying the photoresist and exposure take place, and developing and hardening processes are performed to remove the photoresist from the unexposed portion. Here, all the electrode parts' patterns are formed using one kind of metal, and, to cover the metal of the second electrode part 4 on top of that, a pair of two patterns is formed first.

<Step 314>

First, in S314, where all patterns are already formed by the first electrode part 3, only the portions corresponding to the second electrode part 4 are partially coated by electrolytic plating.

By performing this step, only the portion where the second electrode part 4 is formed in the first electrode part 3 formed on the same surface of the first substrate 1 can be formed using a different metallic material, by electrolytic plating, electrically and structurally apart from each other.

<Step 315 to Step 317>

Next, the middle part 5 to include the nanoparticles and the solvent is formed. The middle part 5 is formed in the space sealed by the first electrode part 3 and the second electrode part 4 formed on the surface, a substrate 2, and the insulating parts 6. The micro space (unfilled portion) in this space (middle part 5) is filled with nanoparticles 15. By this means, the conversion part of the thermoelectric element is formed.

For example, a thermoelectric element 10 formed with the substrates 1 and 2, first electrode part 3, second electrode part 4, and insulating parts 6, is immersed in a stock solution of nanoparticles 15, so that the micro space (unfilled part) of the middle part 5 can be filled by the capillary phenomenon. The middle part 5 is filled from the side surface in the second direction Y, from a predetermined unsealed portion. Following this, for example, the side surface of the laminated part is covered with an insulating material or the like, so that defective filling of the middle part 5 can be prevented.

Here, FIGS. 7A to 7F are schematic cross-sectional views, and each showing an example of the method for manufacturing the thermoelectric element according to the present embodiment of FIG. 5 described above.

Figures 7A, 7B, 7C, 7D, 7E:
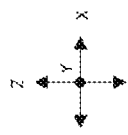
FIGS. 7A to 7E are schematic cross-sectional views to show a second modification of the method for manufacturing a thermoelectric element according to the present embodiment.

FIGS. 7A to 7C correspond to steps of S311 to S313 in FIG. 5, in which the first substrate 1 is formed, a thin film of aluminum is sputtered on the surface of the first substrate 1 in all patterns, and then all patterns of electrode parts are formed at once by the first electrode part 3.

FIG. 7D corresponds to S314 in FIG. 5, and the part corresponding to the second electrode part 4 formed by the first electrode part 3 is partially subjected to electrolytic plating to form the second electrode part 4. FIG. 7E corresponds to steps S315 to S318 of FIG. 5, in which the middle part 5 is formed, and sealing is done so as to secure the micro space in the middle part 5, and insulating parts 6, which serve as sealing for filling the middle part 5 with nanoparticles 15 and closing the filled nanoparticles 15, are formed.

Furthermore, according to the present embodiment, a thermoelectric element can be manufactured with accurate amounts of gaps between electrodes on the same plane, in a simple manner, so that the characteristics of the thermoelectric element can be set as designed. Therefore, variations in performance when a plurality of thermoelectric elements are manufactured can be kept low.

Furthermore, since each electrode part is formed on the same substrate, the gaps between the electrodes do not change even when the temperature changes, and can be kept constant, and this makes it possible to achieve stable output characteristics even when the temperature changes. Furthermore, it is possible to shape each electrode part and the middle part with greater flexibility, so that efficient and stable characteristics can be achieved.

Figure 8A:
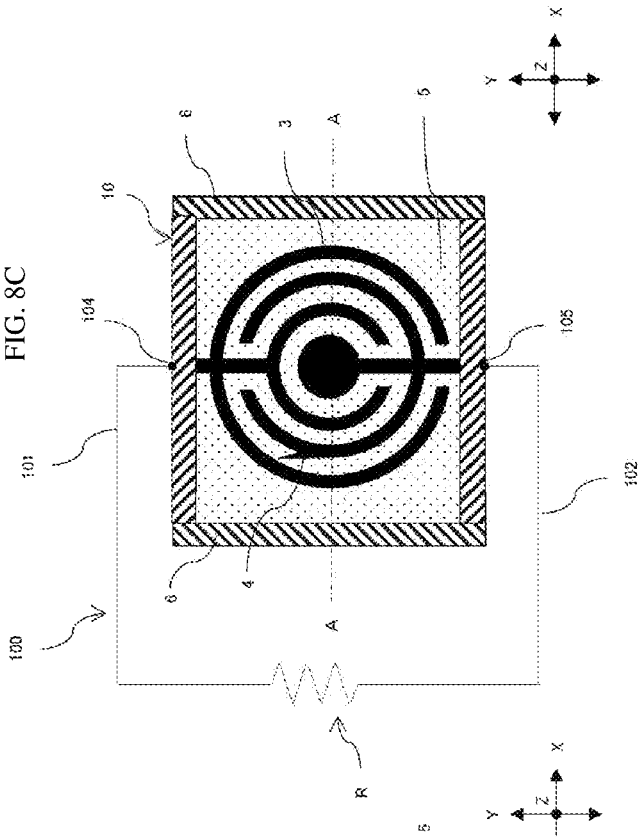
FIG. 8A is a schematic cross-sectional view, taken along line B-B in FIG. 8B to show an example of the configuration of a spiral thermoelectric element and a thermoelectric device according to an embodiment.
Figure 8B:
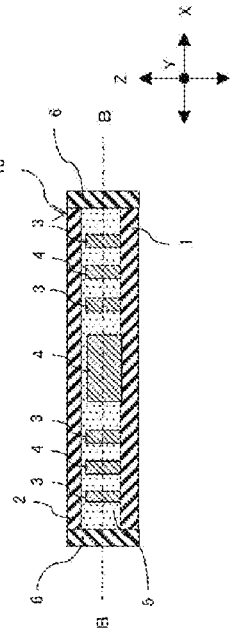
FIG. 8B is a schematic cross-sectional view along line A-A in FIG. 8A.

FIGS. 8A and 8B show examples of the configuration of the spiral thermoelectric element and thermoelectric device according to an embodiment. FIG. 8A is a schematic cross-sectional view, taken along line B-B in FIG. 8B, in which a pair of (two) spiral electrode parts are provided, one spiral being the spiral pattern of the first electrode part 3, and the other spiral pattern being the second electrode part 4. The first electrode part 3 and the second electrode part 4 are formed in a planar shape, at a distance from each other, on the plane of the first substrate 1. The middle part 5 is sealed with insulating parts, and filled with nanoparticles 15.

Figure 8C:
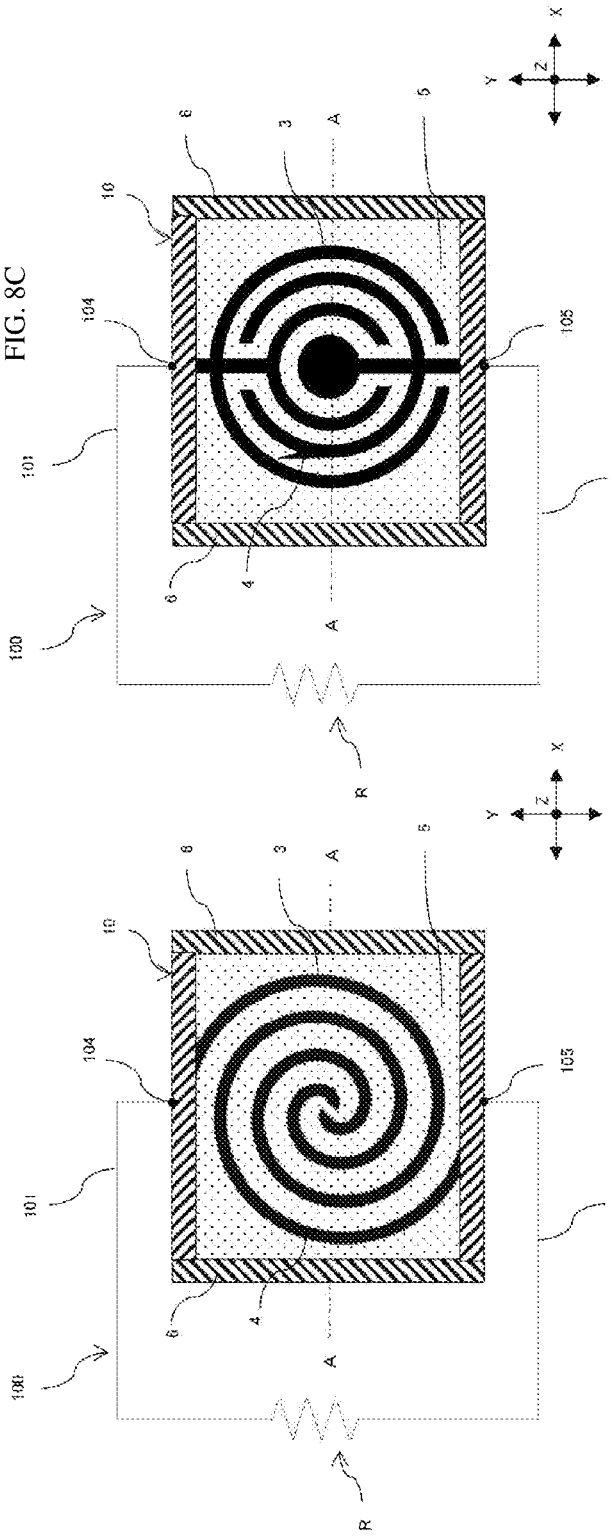
FIG. 8C is a schematic cross-sectional view, taken along line B-B in FIG. 8D, to show an example of the configuration of an annular thermoelectric element and a thermoelectric device, according to the present embodiment.
Figure 8D:
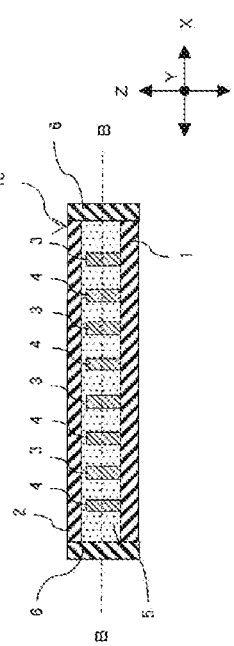
FIG. 8D is a schematic cross-sectional view, taken along line A-A in FIG. 8C.

Also, FIGS. 8C and 8D show examples of the configuration of the annular thermoelectric element and thermoelectric device according to an embodiment. FIG. 8C is a schematic cross-sectional view, taken along line B-B in FIG. 8D, and shows a combination of annular patterns having different diameters. Each pattern is provided with an electrode part, and, to energize these annular patterns, the center of the annular patterns is a combined with a linear pattern. The inside of the middle part 5 is filled with nanoparticles 15. The middle part 5 is not closed inside, so that nanoparticles can fill the middle part 5 easily, forming patterns that allow easy entry and exit.

Regarding the spiral or annular shapes of FIGS. 8A and 8C, electrodes are formed on the same substrate of the thermoelectric element, depending on the shape and number of each electrode part (the number of comb teeth if the electrode part is shaped like comb teeth, the number of circles or spirals if the electrode part is spiral or annular, etc.), so that the gaps between electrodes do not change and can be kept constant even when the temperature changes. This makes it possible to achieve stable output characteristics even when the temperature changes. Furthermore, it is possible to shape each electrode part and the middle part with greater flexibility, so that efficient and stable characteristics can be achieved.

The method for forming a thermoelectric element according to the present embodiment includes a first step of forming a first electrode 3 on the upper surface of a first substrate 1, a second step of forming a second electrode part 4 that has a different work function from that of the first electrode part 3, at a distance from the first electrode part 3, on the same plane of the first substrate 1, and a third step of forming a middle part 5 that is provided between the first electrode part 3 and the second electrode part 4, and that includes nanoparticles 15.

Then, the first step and the second step include the steps of shaping the first electrode part 3 and the second electrode part 4 both like comb teeth. Also, the first step and the second step include the steps of shaping the first electrode part 3 and the second electrode part 4 both spiral or annular. Furthermore, the third step, which is performed after the first step and the second step, includes a step of forming a second substrate and insulating parts 6 in contact with the middle part 5.

As described above, this makes it possible to make a thermoelectric element with accurate amounts of gaps between electrodes, at ease, so that the characteristics of the thermoelectric element can be set as designed. Therefore, variations in performance when a plurality of thermoelectric elements are manufactured can be kept low. Therefore, ease of formation and stability of characteristics can be both achieved.

While embodiments of the present invention have been described, these embodiment have been presented only by way of example, and are not intended to limit the scope of the invention. These novel embodiments can be implemented in a variety of other forms and a variety of omissions, substitutions, and changes can be made without departing from the spirit of the invention. These embodiments and variations thereof are included in the scope and gist of the invention and are included in the invention described in the claims and the equivalent scope thereof.

REFERENCE SIGNS LIST

1: first substrate
2: second substrate
3: first electrode part
4: second electrode part
5: middle part
6: insulator
10: thermoelectric element
15: nanoparticles
15a: coating 16: solvent
100: thermoelectric device
101: first wiring
102: second wiring
104: terminal
105: terminal
R: load
X: first direction
Y: second direction
Z: lamination direction
e: thermoelectrons

The invention claimed is:

1. A thermoelectric element to convert thermal energy into electrical energy, the thermoelectric element comprising:
   a first electrode part;
   a second electrode part having a work function that is different from a work function of the first electrode part, the second electrode part being arranged at a distance from the first electrode part on a same surface of a first substrate as the first electrode part, and a second substrate being arranged at a distance from a top surface of the first electrode part and a top surface of the second electrode part; and
   a middle part provided between a side surface of the first electrode part and a side surface of the second electrode part, the middle part being further provided between the top surface of the first electrode part and the second substrate, and the middle part being further provided between the top surface of the second electrode part and the second substrate,
   wherein the middle part includes a solvent and nanoparticles dispersed the solvent, and
   wherein the side surface of the first electrode part, the side surface of the second electrode part, the top surface of the first electrode part, the top surface of the second electrode part, and the second substrate are in direct contact with the solvent dispersing the nanoparticles.

2. The thermoelectric element according to claim 1, wherein the first electrode part and the second electrode part are each shaped like comb teeth.

3. The thermoelectric element according to claim 1, wherein the first electrode part and the second electrode part each have a spiral or annular shape.

4. The thermoelectric element according to claim 1, wherein a first distance between the first electrode part and the second electrode part is 10 μm or less, and wherein a diameter of the nanoparticles is 1/10 or less of the first distance.

5. The thermoelectric element according to claim 1, wherein the nanoparticles have a surface coating of a material that is different from a material of an inner part of the nanoparticles, and wherein a thickness of the coating is at least 0.2 nm and not more than 5.0 nm.

6. The thermoelectric element according to claim 1, wherein the nanoparticles have a work function between the work function of the first electrode part and the work function of the second electrode part.

7. The thermoelectric element according to claim 1, wherein the solvent of the middle part has a boiling point of 60° C. or higher.

8. The thermoelectric element according to claim 1, further comprising an insulating part in contact with the middle part.

9. A thermoelectric device for converting thermal energy into electrical energy, the thermoelectric device comprising:
   a first substrate having an insulating property;
   a first electrode part;
   a second electrode part having a work function that is different from a work function of the first electrode part, the second electrode part being arranged at a distance from the first electrode part on a same surface of the first substrate as the first electrode part;
   a second substrate being arranged at a distance from a top surface of the first electrode part and a top surface of the second electrode part;
   a middle part provided between a side surface of the first electrode part and a side surface of the second electrode part, the middle part being further provided between the top surface of the first electrode part and the second substrate, and the middle part being further provided between the top surface of the second electrode part and the second substrate; and
   first wiring and second wiring electrically connected with the first electrode part and the second electrode part,
   wherein the middle part includes a solvent and nanoparticles dispersed the solvent, and
   wherein the side surface of the first electrode part, the side surface of the second electrode part, the top surface of the first electrode part, the top surface of the second electrode part, and the second substrate are in direct contact with the solvent dispersing the nanoparticles.

10. The thermoelectric device according to claim 9, wherein the first electrode part and the second electrode part are each shaped like comb teeth.

11. The thermoelectric device according to claim 9, wherein the first electrode part and the second electrode part each have a spiral or annular shape.

12. The thermoelectric device according to claim 9, further comprising an insulating part in contact with the middle part.

* * * * *